(12) United States Patent
Moriwaki

(10) Patent No.: US 10,483,473 B2
(45) Date of Patent: Nov. 19, 2019

(54) ELECTRONIC DEVICE AND SOLID STATE IMAGING APPARATUS

(71) Applicant: SONY CORPORATION, Tokyo (JP)

(72) Inventor: Toshiki Moriwaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/741,236

(22) PCT Filed: May 20, 2016

(86) PCT No.: PCT/JP2016/065016
§ 371 (c)(1),
(2) Date: Dec. 29, 2017

(87) PCT Pub. No.: WO2017/006634
PCT Pub. Date: Jan. 12, 2017

(65) Prior Publication Data
US 2018/0240991 A1    Aug. 23, 2018

(30) Foreign Application Priority Data

Jul. 8, 2015  (JP) ................................. 2015-136650
Mar. 9, 2016  (JP) ................................. 2016-045278

(51) Int. Cl.
*H01L 51/44* (2006.01)
*H01L 27/30* (2006.01)
(Continued)

(52) U.S. Cl.
CPC ............ *H01L 51/442* (2013.01); *C23C 14/08* (2013.01); *H01L 27/146* (2013.01);
(Continued)

(58) Field of Classification Search
CPC ...... H01L 51/00; H01L 51/001; H01L 51/007; H01L 51/0072; H01L 51/44;
(Continued)

(56) References Cited

U.S. PATENT DOCUMENTS

2013/0098449 A1    4/2013  Okubo et al.
2013/0099225 A1    4/2013  Nihei et al.
(Continued)

FOREIGN PATENT DOCUMENTS

CN    102971881 A    3/2013
CN    104103760 A    10/2014
(Continued)

OTHER PUBLICATIONS

Hyomen Gijutsu Benran, "Supplement 2. Shukiritsu Hyo to Genso no Butsuri Teisu", 1st Edition, Isao Mizoguchi The Nikkan Kogyo Shinbun, Ltd. , Feb. 27, 1998, pp. 1792-1797.
(Continued)

*Primary Examiner* — Monica D Harrison
(74) *Attorney, Agent, or Firm* — Chip Law Group

(57) ABSTRACT

Disclosed herein is an electronic device including a first electrode 21, a second electrode 22, and a photoelectric conversion layer 23 held between the first electrode 21 and the second electrode 22. The first electrode 21 is formed from a transparent conductive material having a work function ranging from 5.2 to 5.9 eV, preferably from 5.5 to 5.9 eV, more preferably 5.8 to 5.9 eV.

25 Claims, 8 Drawing Sheets

(51) Int. Cl.
  *C23C 14/08* (2006.01)
  *H01L 27/146* (2006.01)
  *H01L 51/52* (2006.01)
  *H01L 51/00* (2006.01)
  *H04N 5/361* (2011.01)
  *H04N 5/376* (2011.01)

(52) U.S. Cl.
  CPC ........ H01L 27/307 (2013.01); H01L 51/5215 (2013.01); *H01L 51/001* (2013.01); *H01L 51/0072* (2013.01); *H01L 2251/308* (2013.01); *H04N 5/361* (2013.01); *H04N 5/3765* (2013.01); *Y02E 10/549* (2013.01)

(58) Field of Classification Search
  CPC ....... H01L 51/442; H01L 31/10; H01L 27/14; H01L 27/146; H01L 27/30; H01L 27/307
  USPC .......................................... 257/40
  See application file for complete search history.

(56) References Cited

U.S. PATENT DOCUMENTS

2014/0054577 A1* 2/2014 Mitsui ................. C09B 23/0066
                                                                257/40
2014/0306180 A1   10/2014 Moriwaki et al.

FOREIGN PATENT DOCUMENTS

| CN | 105118920 A | 12/2015 |
|---|---|---|
| EP | 2592670 A1 | 5/2013 |
| JP | 2009-122416 A | 6/2009 |
| JP | 2012-019132 A | 1/2012 |
| JP | 2014-220488 A | 11/2014 |
| KR | 10-2013-0040208 A | 4/2013 |
| WO | 2012/002246 A1 | 1/2012 |
| WO | 2012/005174 A1 | 1/2012 |

OTHER PUBLICATIONS

"supplement 2. Shukiritsu Hyo to Genso no Butsuri Teisu", Hyomen Gijutsu Benran, 1st edition, Isao Mizoguchi The Nikkan Kogyo Shinbun, Ltd. , Feb. 27, 1998, pp. 1792-1797.

International Search Report and Written Opinion of PCT Application No. PCT/JP2016/065016, dated Aug. 2, 2016, 09 pages of ISRWO.

* cited by examiner

ELECTRONIC DEVICE AND SOLID STATE IMAGING APPARATUS

CROSS REFERENCE TO RELATED APPLICATIONS

This application is a U.S. National Phase of International Patent Application No. PCT/JP2016/065016 filed on May 20, 2016, which claims priority benefit of Japanese Patent Application No. JP 2015-136650 filed in the Japan Patent Office on Jul. 8, 2015 and also claims priority benefit of Japanese Patent Application No. JP 2016-045278 filed in the Japan Patent Office on Mar. 9, 2016. Each of the above-referenced applications is hereby incorporated herein by reference in its entirety.

TECHNICAL FIELD

The present disclosure relates to an electronic device and a solid state imaging apparatus.

BACKGROUND ART

Any electronic device used as photoelectric conversion elements for image sensors or the like is usually constructed such that one photoelectric conversion layer is held between two electrodes. Such an electronic device is known from JP 2014-220488A. The electronic device disclosed in JP 2014-220488A includes a first electrode, a second electrode, and a photoelectric conversion layer held between the first and second electrodes, in which the first electrode is formed from an amorphous oxide of at least quaternary compound containing indium, gallium and/or aluminum, zinc, and oxygen, such that the second electrode exceeds the first electrode in work function by no smaller than 0.4 eV. In addition, specifically, the second electrode in work function is larger than the first electrode in work function.

CITATION LIST

Patent Literature

[PTL 1]
  JP 2014-220488A

SUMMARY OF THE INVENTION

Technical Problems

The electronic device disclosed in the laid-open official gazette mentioned above specifies a certain value of difference in work function between the second electrode and the first electrode. This difference in work function leads to an improved internal quantum efficiency and reduced dark current when a bias voltage is applied across the first and second electrodes. Unfortunately, the first electrode has a work function ranging from 4.1 to 4.5 eV, and the second electrode has a work function ranging from 4.8 eV and 5.0 eV. This means that the electrode being configured from materials having a high work function (or the second electrode in the electronic device disclosed in JP 2014-220488A) is limited in selection from transparent conductive materials. Accordingly, it is necessary for the electrode to be formed from a species selected from a wide range of transparent conductive materials. Moreover, the electronic device is required to have outstanding characteristic properties, such as improved internal quantum efficiency, low specific resistance, and small dark current.

It is an object of the present disclosure to provide an electronic device and a solid state imaging apparatus included of such electronic devices, the electronic device being formed from a species selected from a wide range of transparent conductive materials and having outstanding characteristic properties.

Solution to Problems

The electronic device according to the present disclosure which has been completed to achieve the foregoing object includes a first electrode, a second electrode, and a photoelectric conversion layer held between the first electrode and the second electrode, in which the first electrode is formed from a transparent conductive material having a work function ranging from 5.2 to 5.9 eV, preferably from 5.5 to 5.9 eV, more preferably 5.8 to 5.9 eV.

The solid state imaging apparatus according to the present disclosure which has been completed to achieve the foregoing object includes the electronic devices according to the present disclosure defined above.

Advantageous Effects of Invention

The electronic device disclosed herein and the electronic device constituting the solid state imaging apparatus disclosed herein will collectively referred to as "the electronic device or the like disclosed herein" herein after. The electronic device disclosed herein is characterized in that the first electrode is formed from a transparent conductive material having a work function ranging from 5.2 to 5.9 eV. The work function in such a range permits the second electrode to be formed from a species selected from a wide range of transparent conductive materials, so that the first and second electrodes greatly differ in work function from each other. This leads to the electronic device having outstanding characteristic properties. Incidentally, the effects mentioned in this specification are merely exemplary and not intended to restrict the scope of the present disclosure, and it may have additional effects.

DESCRIPTION OF EMBODIMENTS

Figure 1A:
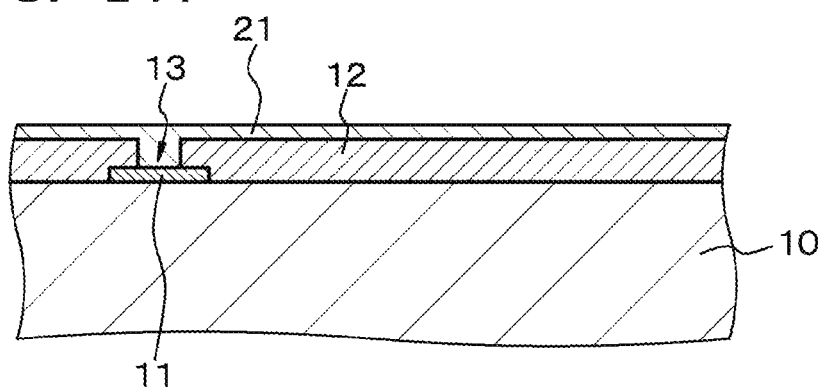
FIGS. 1A and 1B are schematic partial sectional views of a substrate or the like which are intended to explain the method of producing an electronic device according to Example 1.

The present disclosure will be described below based on the examples with reference to the drawings. The disclosure mentioned herein is not intended to restrict the scope of the disclosure, and values and materials depicted in Examples are merely exemplary. The description proceeds in the following order.
1. General description of electronic device and solid state imaging apparatus according to the present disclosure
2. Example 1 (electronic device according to the present disclosure)
3. Example 2 (solid state imaging apparatus according to the present disclosure)
4. Supplements
<General Description of Electronic Device and Solid State Imaging Apparatus According to the Present Disclosure>

The electronic device or the like according to the present disclosure relies on a transparent conductive material which is composed of indium oxide and at least one metal species selected from a group consisting of cerium (Ce), gallium (Ga), tungsten (W), and titanium (Ti), with the metal species accounting for 0.5 to 10 atom % of the total amount (100 atom %) of the indium and the metal species. Alternatively, the electronic device or the like according to the present disclosure relies on the transparent conductive material which is composed of indium oxide and cobalt, with the cobalt accounting for 10 to 30 atom % of the total amount (100 atom %) of the indium and the cobalt. Here, "Addition" of the supplementary components includes mixing and doping.

The electronic device or the like according to the present disclosure should preferably be embodied such that the first electrode has a specific resistance (electrical resistance) smaller than $1 \times 10^{-2}$ Ω·cm and also has a sheet resistance of $3 \times 10$ to $1 \times 10^3$ Ω/□.

Furthermore, the electronic device or the like according to the present disclosure should preferably be embodied such that the first electrode has a refractive index ranging from 1.9 to 2.2, so that the first electrode can effectively transmit light having a broad spectrum bandwidth ("transmission light spectral bandwidth").

Furthermore, the electronic device or the like according to the present disclosure should preferably be embodied such that the first electrode has surface roughness (arithmetic average roughness) Ra no larger than 1 nm, so that the photoelectric conversion layer to be formed on the first electrode has uniform properties, which helps improve yield in production of the electronic device. In addition, the surface roughness should preferably be such that Rms (Rq: root mean square value roughness) is no larger than 2 nm.

According to the preferred embodiment mentioned above, the electronic device or the like disclosed herein should have the first electrode whose thickness ranges from $1 \times 10^{-8}$ to $2 \times 10^{-7}$ m, preferably $2 \times 10^{-8}$ to $1 \times 10^{-7}$ m.

Alternatively, the electronic device or the like disclosed herein is characterized in that the transparent conductive material is composed of indium oxide and cerium (Ce) [or indium-cerium complex oxide (ICO)] and the first electrode has a thickness ranging from $5 \times 10^{-8}$ to $2 \times 10^{-7}$ m and also has a specific resistance no smaller than $1 \times 10^{-3}$ Ω·cm and smaller than $1 \times 10^{-2}$ Ω·cm. The amount of cerium should be such that cerium atoms account for 1 to 10 atom % in the total (100 atom %) of indium atoms and cerium atoms. Moreover, the transparent conductive material is composed of indium oxide and gallium (Ga) [or indium-gallium complex oxide (IGO)], and the first electrode has a thickness ranging from $5 \times 10^{-8}$ to $1.5 \times 10^{-7}$ m and also has a specific resistance ranging from $1 \times 10^{-5}$ to $1 \times 10^{-3}$ Ω·cm. The amount of gallium should be such that gallium atoms account for 1 to 30 atom %, preferably 1 to 10 atom %, in the total (100 atom %) of indium atoms and gallium atoms. Furthermore, the transparent conductive material is composed of indium oxide and tungsten (W) [or indium-tungsten complex oxide (IWO)], and the first electrode has a thickness ranging from $5 \times 10^{-8}$ to $2 \times 10^{-7}$ m and also has a specific resistance ranging from $1 \times 10^{-4}$ to $1 \times 10^{-3}$ Ω·cm. The amount of tungsten should be such that tungsten atoms account for 1 to 7 atom % in the total (100 atom %) of indium atoms and tungsten atoms. Moreover, the transparent conductive material is composed of indium oxide and titanium (Ti) [or indium-titanium complex oxide (ITiO)], and the first electrode has a thickness ranging from $5 \times 10^{-8}$ to $2 \times 10^{-7}$ m and also has a specific resistance ranging from $1 \times 10^{-4}$ to $1 \times 10^{-3}$ Ω·cm. The amount of titanium should be such that titanium atoms account for 0.5 to 5 atom % in the total (100 atom %) of indium atoms and titanium atoms. Moreover, the transparent conductive material is composed of indium oxide and cobalt (Co) [or indium-cobalt complex oxide (ICoO)], and the first electrode has a thickness ranging from $5 \times 10^{-3}$ to $2 \times 10^{-7}$ m and also has a specific resistance ranging from $1 \times 10^{-4}$ to $1 \times 10^{-3}$ Ω·cm. The amount of cobalt should be such that cobalt atoms account for 10 to 30 atom % in the total (100 atom %) of indium atoms and cobalt atoms. Thus, it is possible to obtain the desired specific resistance and to enlarge the spectral bandwidth of the transmitting light by specifying the ratio of cerium atoms, gallium atoms, tungsten atoms, titanium atoms, and cobalt atoms.

In addition, according to the preferred embodiment and configuration mentioned above, the electronic device or the like disclosed herein is characterized in that the first and second electrodes have respective work functions such that the subtraction of the second from the first is no smaller than 0.4 eV. The difference in work functions specified above generates an internal electric field in the photoelectric conversion layer, thereby improving the internal quantum efficiency.

In addition, according to the preferred embodiment and configuration mentioned above, the electronic device or the like disclosed herein is characterized in that the second electrode has a work function no larger than 5.0 eV, with the lower limit being 4.1 eV, for example.

In addition, according to the preferred embodiment and configuration mentioned above, the electronic device or the like disclosed herein is characterized in that the second electrode is formed from indium-tin complex oxide (ITO), indium-zinc complex oxide (IZO), or tin oxide ($SnO_2$). The second electrode formed from the transparent conductive material has a work function ranging from 4.8 to 5.0 eV, depending on film forming conditions. Alternatively, the second electrode may be formed from a transparent conductive material, such as gallium-zinc complex oxide doped with indium (IGZO, In—$GaZnO_4$), zinc oxide doped with aluminum oxide (AZO), indium-zinc complex oxide (IZO), and zinc oxide doped with gallium (GZO). The second electrode formed from any one of the transparent conductive materials mentioned above has a work function ranging from 4.1 to 4.5 eV, depending on film forming conditions.

In addition, according to the preferred embodiment and configuration mentioned above, the electronic device or the like disclosed herein is characterized in that the first electrode is formed by the sputtering method. The first electrode has its transmitted light spectral bandwidth controlled by adjusting the amount of oxygen gas (oxygen gas partial pressure) to be introduced for sputtering. Moreover, according to the preferred embodiment and configuration mentioned above, the electronic device or the like disclosed herein is characterized in that the first electrode contains a less amount of oxygen than the oxygen content based on the stoichiometric composition. As the oxygen content decreases more than the oxygen content based on the stoichiometric composition, the oxygen deficiency increases.

In addition, according to the preferred embodiment and configuration mentioned above, the electronic device or the like disclosed herein is characterized in that the first electrode has a light transmittance preferably, no smaller than 80% for light having a wavelength ranging from 400 to 660 nm. Moreover, the second electrode may have a light transmittance preferably, no smaller than 80% for light having a wavelength ranging from 400 to 660 nm.

In addition, according to the preferred embodiment and configuration mentioned above, the electronic device or the like disclosed herein is included of photoelectric conversion elements.

According to the preferred embodiment and configuration mentioned above, the electronic device or the like disclosed herein is included of the substrate, the first electrode, the photoelectric conversion layer, and the second electrode, which are sequentially formed one over another. Alternatively, the electronic device is included of the substrate, the second electrode, the photoelectric conversion layer, and the first electrode, which are sequentially formed one over another. In other words, the electronic device or the like disclosed herein is that of two-terminal type which has the first electrode and the second electrode. However, it may also be of three-terminal type, which has an additional control electrode to control current by voltage applied thereto. The electronic device of three-terminal type may have the same structure as the field-effect transistor (FET), specifically, of bottom-gate/bottom-contact type, bottom-gate/top-contact type, top-gate/bottom-contact type, or top-gate/top-contact type. Incidentally, the first electrode functions as anode (namely, to collect holes), on the other hand the second electrode functions as cathode (namely, to collect electrons). The electronic device or the like may be a multi-layered one, each having the photoelectric conversion layer varying in light absorption spectrum. Further, the electronic device or the like may also be modified such that the substrate is formed from silicon semiconductor and the substrate supports thereon the drive circuits and photoelectric conversion layer.

The photoelectric conversion layer may be an amorphous one or a crystalline one. The photoelectric conversion layer may be formed from organic materials such as organic semiconductor, organometal compound, organic semiconductor fine particles, metal oxide semiconductor, inorganic semiconductor fine particles, material of core-shell structure, and organic-inorganic hybrid compound.

Examples of the organic semiconductor includes the following. Organic dyes represented by quinacridone and derivatives thereof. $Alq_3$ [tris(8-quinolinolato)aluminum (III)], which is a dye obtained by chelating with an organic material the ion of previous period (referred to transition metal, the left side in periodic table). Organometal dye represented by phthalocyanine zinc (II) which is a complex compound a transition metal and an organic material. Dinaphthothienothiophene (DNTT).

Examples of the organometal compound include the following. Dye obtained by chelating with an organic material the ion of previous period transition metal, which has been mentioned above. Organometal dye as a complex formed from transition metal ion and organic material. Examples of the organic semiconductor fine particles include the following. Associated material of organic dye represented by quinacridone and derivative thereof, mentioned above. Associated material of a dye obtained by chelating with an organic material the ion of previous period transition metal. Associated material of an organometal dye in complex form obtained from transition metal ion and organic material. Prussian blue in which metal ions are crosslinked with cyano groups, or a derivative or complex associated material thereof.

Examples of the metal oxide semiconductor and inorganic semiconductor fine particles include the following. ITO, IGZO, ZnO, IZO, $IrO_2$, $TiO_2$, $SnO_2$, $SiO_x$, ZnO, CdTe, GaAs, Si, and metal chalcogen semiconductor (such as CdS, CdSe, ZnS, CdSe/CdS, CdSe/ZnS, and PbSe). [chalcogen includes such elements as sulfur (S), selenium (Se), and tellurium (Te).]

Examples of the core-shell material (composed of core and covering shells) include those of organic material (such as polystyrene and polyaniline) and metallic material (easily or hardly ionizable). Examples of the organic-inorganic hybrid compound include coordinate polymer, which is a generic term embracing Prussian blue and derivatives thereof in which metal ions are crosslinked with cyano groups, and others in which metal ions are crosslinked infinitely with bipyridine or others in which metal ions are crosslinked with multi-charged ionic acid such as oxalic acid and rubeanic acid.

The photoelectric conversion layer may be formed by any one of coating method, physical vapor deposition (PVD) method, and chemical vapor deposition (CVD) method including MOCVD method, which are appropriately selected according to the material employed. Examples of the coating method include spin coating; dipping; casting; printing such as screen printing, ink jet printing, offset printing, and gravure printing; stamping; spraying; and coating such as air doctor coating, blade coating, rod coating, knife coating, squeeze coating, reverse roll coating, transfer roll coating, gravure coating, kis coating, cast coating, spray coating, slit orifice coating, and calender coating.

Incidentally, the coating method may employ such solvent as toluene, chloroform, hexane, and ethanol, which are non-polar or weak-polar organic solvents. In addition examples of the PVD method include vacuum vapor deposition such as electron beam heating, resistance heating, and flush deposition; plasma deposition; sputtering such as bipolar sputtering, DC sputtering, DC magnetron sputtering, high-frequency sputtering, magnetron sputtering, ion beam sputtering and bias sputtering; and ion plating method such as DC (direct current) method, RF method, multicathode method, activating reaction method, electric field vapor deposition method, high-frequency ion plating method, and reactive ion plating.

The photoelectric conversion layer is not specifically restricted in thickness; an ordinary thickness ranges from $1\times10^{-10}$ to $5\times10^{-7}$ m, for example.

The first electrode is formed by sputtering, specifically, magnetron sputtering and parallel plate sputtering. Sputtering may be performed with plasma generated by DC discharging or RF discharging. Incidentally, according to the present disclosure, the first electrode may have its characteristic properties properly controlled and improved by adjusting the flow rate and partial pressure of oxygen gas. Thus, the first electrode is made to have an adequately controlled specific resistance and an expanded spectrum range of transmitted light, for example.

The first electrode which has been formed as mentioned above may optionally undergo surface treatment before it is coated with the photoelectric conversion layer. The surface treatment includes irradiation to UV light or oxygen plasma, for example. The effect of the surface treatment is decontamination of the surface of the first electrode and improved adhesion between the first electrode and the photoelectric conversion layer when the photoelectric conversion layer is formed. In addition, the surface treatment causes the first electrode to change the state (specifically, decrease) in oxygen deficiency and to increase in work function.

The second electrode can be formed by any one method selected from the following according to the material used therefor. Sputtering method such as vacuum deposition and reactive vapor deposition, PVD method such as ion beam deposition and ion plating, pyrosol method, thermal decomposition of organometallic compound, spraying method, dipping method, CVD method such as MOCVD, electroless plating method, and electrolytic plating.

The substrate may be formed from any one of organic polymers including, for example, polymethyl methacrylate (PMMA), polyvinyl alcohol (PVA), polyvinylphenol (PVP), polyether sulfone (PES), polyimide, polycarbonate (PC), polyethylene terephthalate (PET), and polyethylene napthalate (PEN). These polymers may be used in the form flexible film or sheet. The resulting flexible substrate leads to the electronic device that can be built into any electronic apparatus with a curved shape. Alternatively, the substrate may also be formed from any one of the following materials: glass plate with or without insulation film formed thereon, quartz plate with or without insulation film formed thereon, silicon semiconductor plate with or without insulation film formed thereon, and metal plate including that of alloy or stainless steel or the like. Incidentally, the insulation films include those which are made of silicon oxide (such as $SiO_x$ and spin on glass (SOG)); silicon nitride ($SiN_Y$), silicon oxynitride (SiON); aluminum oxide ($Al_2O_3$); metal oxide and metal salt. The substrate may also be a conductive substrate (made of metal (e.g., gold and aluminum) or highly oriented graphite) which has its surface coated with the insulation film. The substrate should preferably have a smooth surface, but slight roughness is permissible so long as it has no adverse effect on the characteristic properties of the photoelectric conversion layer. The substrate may have its surface coated with a thin film (as explained below) so as to improve adhesion between the substrate and the first electrode or the second electrode. The thin film for this purpose may be formed from a silanol derivative by silane coupling method, thiol derivative by SAM method or the like, carboxylic acid derivative, phosphoric acid derivative, or insulative metal salt or complex by CVD method or the like.

The first electrode or the second electrode may have a coating layer, according to circumstances. The coating layer may be formed from any one of the following materials. Inorganic insulating materials such as silicon oxide; silicon nitride ($SiN_Y$); and metal oxide (e.g., aluminum oxide ($Al_2O_3$)). Organic insulating materials (organic polymers) such as polymethyl methacrylate (PMMA); polyvinylphenol (PVP); polyvinyl alcohol (PVA); polyimide; polycarbonate (PC), polyethylene terephthalate (PET), polystyrene, silanol derivative (e.g., N-2(aminoethyl)3-aminopropyltrimethoxysilane (AEAPTMS), 3-mercaptopropyltrimethoxysilane (MPTMS), and octadecyltrichlorosilane (OTS)), octadecane thiol, and dodecylisocyanate. These compounds are linear hydrocarbons which have at one end functional groups capable of bonding with the control electrode. They may be used in combination with one another.

Incidentally, the silicon oxide materials include silicon oxide ($SiO_x$), BPSG, PSG, BSG, AsSG, PbSG, silicon oxynitride (SiON), and SOG (spin on glass). The low-dielectric materials include polyarylether, cycloperfluorocarbon polymer, benzocyclobutene, cyclic fluororesin, polytetrafluoroethylene, fluoroaryl ether, fluoropolyamide, amorphous carbon, and organic SOG. The insulating layer may be formed by any one of the above-mentioned methods, such as PVD method; CVD method; spin coating method; coating method; sol-gel method; electrodeposition method; shadow mask method; and praying method.

The electronic device disclosed herein may be applied to not only a solid-state imaging apparatus such as TV camera but also light sensor and image sensor.

Example 1

Figure 1B:
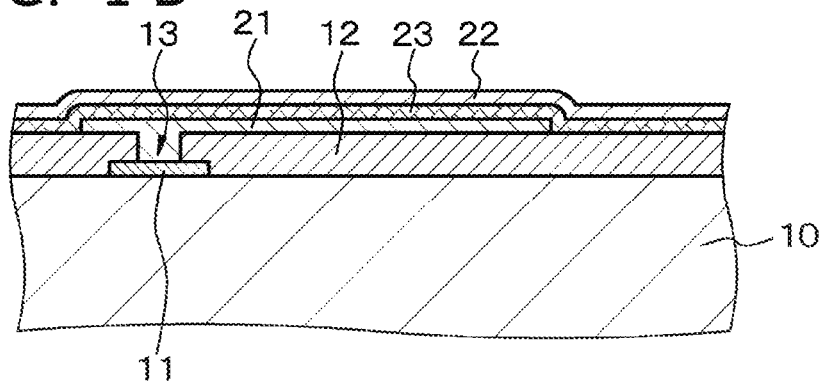

Example 1 deals with the electronic device disclosed herein. The electronic device of Example 1 is illustrated in FIG. 1B which is a schematic partly sectional view.

The electronic device of Example 1 is specifically a photoelectric conversion element. It is included of a first electrode 21, a second electrode 22, and a photoelectric conversion layer 23 held between the first and second electrodes. The first electrode is formed from a transparent conductive material with a work function ranging from 5.2 to 5.9 eV, preferably from 5.5 to 5.9 eV, and more preferably from 5.8 to 5.9 eV. The first electrode 21, the photoelectric conversion layer 23, and the second electrode 22 are sequentially arranged on top of the other on a substrate 10 of silicon semiconductor. In other words, the electronic device according to Example 1 is that of two-terminal structure having the first electrode 21 and the second electrode 22.

The electronic device of Example 1 is characterized in that the first electrode 21 is formed from a transparent conductive material which is composed of indium oxide and at least one species of metal selected from a group consisting of cerium (Ce), gallium (Ga), tungsten (W), and titanium (Ti), with the metal accounting for 0.5 to 10 atom % in the total amount (100 atom %) of the indium atoms and the metal atoms (Examples 1A, 1B, 1C, and 1D). Alternatively, the transparent conductive material is composed of indium oxide and cobalt, with the cobalt accounting for 10 to 30 atom % in the total amount (100 atom %) of the indium atoms and the cobalt atoms (Example 1E).

To be more specific, the electronic device of Example 1 has the second electrode 22 formed from indium-tin complex oxide (ITO). The second electrode 22 is required to have a work function no larger than 5.0 eV, for example, ranging from 4.8 to 5.0 eV, with the actual value varying depending on the forming conditions. The first electrode 21 functions as an anode which gives off holes. The second electrode 22 functions as a cathode which gives off electrons. The photoelectric conversion layer 23 is a film of quinacridone in 100 µm thick.

The electronic device of Example 1 satisfies the following requirements. The first electrode 21 should have a specific resistance smaller than $1 \times 10^{-2}$ Ω·cm, a sheet resistance ranging from $3 \times 10$ to $1 \times 10^3$ Ω/□, a refractive index ranging from 1.9 to 2.2, and a thickness ranging from $1 \times 10^{-8}$ to $2 \times 10^{-2}$ m, preferably $2 \times 10^{-8}$ to $1 \times 10^{-2}$ m. It was found that the first electrode with a thickness of 100 nm has a sheet resistance of 60Ω/□. The first electrode 21 should be formed by sputtering with an amount of oxygen gas to be introduced (oxygen gas partial pressure), so that it has an adequately controlled spectral bandwidth for transmitting light. In addition, the first electrode should contain oxygen in an amount less than the stoichiometric amount.

The first electrode 21 as well as the second electrode 22 should have a light transmittance no smaller than 80% for the wavelength ranging from 400 to 660 nm. The light transmittance of the first electrode 21 and the second electrode 22 can be measured by observing the electrode formed on a transparent glass plate.

The electronic device of Example 1 is prepared by the process which is described below with reference to FIGS. 1A and 1B.

Step-100

The first step is to get ready the substrate 10 of silicon semiconductor, which has thereon the drive circuit (for the electronic device), the photoelectric conversion layer (both not depicted), a wiring 11, and an insulating layer 12 (in contact with the surface thereof). The insulating layer 12 has an opening 13 which permits the wiring 11 to expose itself at the bottom thereof. The next step is to coat the insulating layer 12 containing the opening 13 by co-sputtering with the first electrode 21 of the transparent conductive material mentioned above (see FIG. 1A). Sputtering was performed by using a parallel plate sputtering apparatus or DC magnetron sputtering apparatus, argon (Ar) as the process gas, and a target of sintered body composed of indium oxide and any one of cerium, gallium, tungsten, titanium, and cobalt.

Step-110

In the subsequent step, the first electrode 21 undergoes patterning and surface treatment by irradiation with UV light. Then, the treated surface of the first electrode 21 is entirely coated by vacuum deposition with the photoelectric conversion layer 23 of quinacridone. The photoelectric conversion layer 23 is further coated by sputtering with the second electrode 22 of ITO. Sputtering was performed by using a parallel plate sputtering apparatus or DC magnetron sputtering apparatus, argon (Ar) as the process gas, and a target of sintered body of ITO. Thus there was obtained the electronic device of Example 1 which has the structure depicted in FIG. 1B.

Comparative Example 1 was carried out to produce the electronic device of Comparative Example 1 in the same way as Example 1 except that the first electrode was formed from ITO.

Each of the electronic devices of Example 1 and Comparative Example 1 has the first electrode which is specified by composition, amount of metal added, crystallizing temperature, optical properties (refractive index), specific resistance, and work function, before and after surface treatment, as depicted in Table 1. The surface treatment by irradiation with UV light causes the first electrode to increase in work function, which results in a large difference in work function between the first electrode and the second electrode. In other words, the first electrode 21 and the second electrode 22 have respective work functions such that the subtraction of the latter from the former gives a difference no smaller than 0.4 eV. The difference in work functions as specified above allows the photoelectric conversion layer 23 to generate an internal electric field, thereby improving the internal quantum efficiency. Table 1 depicts "Difference-A" which denotes the difference between the work function of the first electrode, before treatment, in each of Example 1 and the work function of the first electrode, before treatment in Comparative Example 1, and "Difference-B" which denotes the difference between the work function of the first electrode, after treatment in each of Example 1 and the work function of the first electrode, after treatment in Comparative Example 1. Incidentally, the second electrode in each of Example 1 and Comparative Example 1 was formed from ITO and had a work function of 4.8 eV.

TABLE 1

|  | Unit | Examples | | | | | Comp. Example 1 |
|---|---|---|---|---|---|---|---|
|  |  | 1A | 1B | 1C | 1D | 1E |  |
| Denotation |  | ICO | IGO | IWO | ITiO | ICiO | ITO |
| Composition |  | In—Ce—O | In—Ga—O | In—W—O | In—Ti—O | In—Co—O | In—Sn—O |
| Amount added | Atom % | 10 | 10 | 1-7 | 0.5 | 5 | 20 | 10 |
| Crystallizing temperature | ° C. | ca, 300 | 230- | 200- | 150-200 | 150-200 | 230- | 150-200 |
| Refractive index |  | 2.0 | 2.0 | 2.0 | 2.0 | 2.0 | 2.0 | 1.9-2.0 |
| Specific resistance |  | $2 \times 10^{-3}$ | $4 \times 10^{-4}$ | $4 \times 10^{-4}$ | $2 \times 10^{-4}$ | $2 \times 10^{-4}$ | $2 \times 10^{-4}$ | $4 \times 10^{-4}$ |
| Work function |  |  |  |  |  |  |  |  |
| Before Treatment | eV | 5.7 | 5.7 | 5.2 | 5.5 | 5.2 | 5.2 | 4.8 |
| After Treatment |  | 5.8 | 5.9 | 5.8 | 5.8 | 5.9 | 5.8 | 5.0 |

TABLE 1-continued

|  | Unit | Examples | | | | | Comp. |
|---|---|---|---|---|---|---|---|
|  |  | 1A | 1B | 1C | 1D | 1E | Example 1 |
| Difference - A |  | 0.9 | 0.9 | 0.4 | 0.7 | 0.4 | 0.4 |
| Difference - B |  | 0.8 | 0.9 | 0.8 | 0.8 | 0.9 | 0.8 |

Figure 2A:
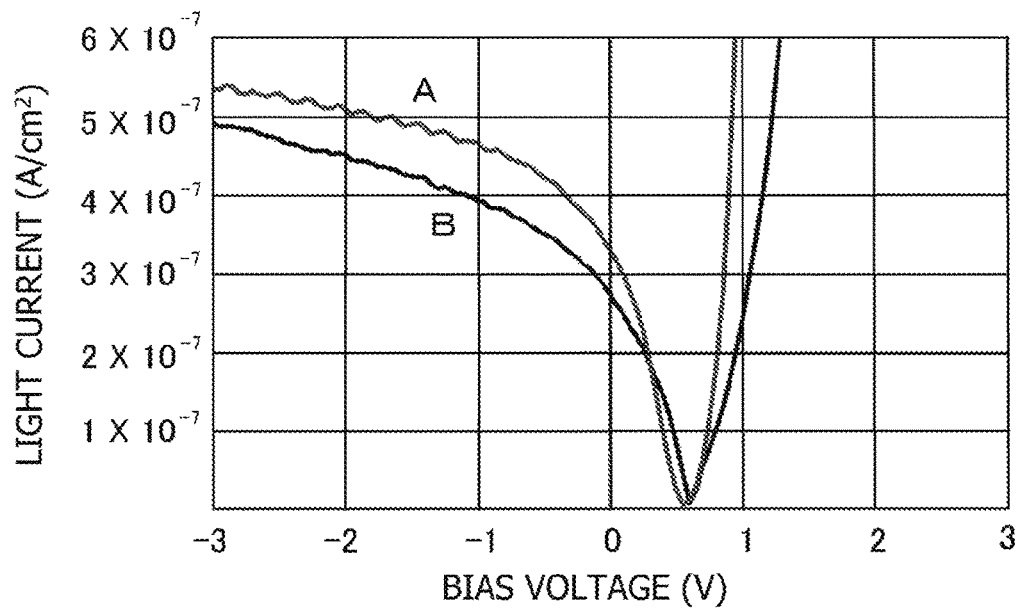
FIGS. 2A and 2B are graphs representing I-V curve observed in electronic devices according to Example 1A and Comparative Example 1, in which a first electrode is formed from indium-cerium complex oxide and ITO, respectively.
Figure 2B:
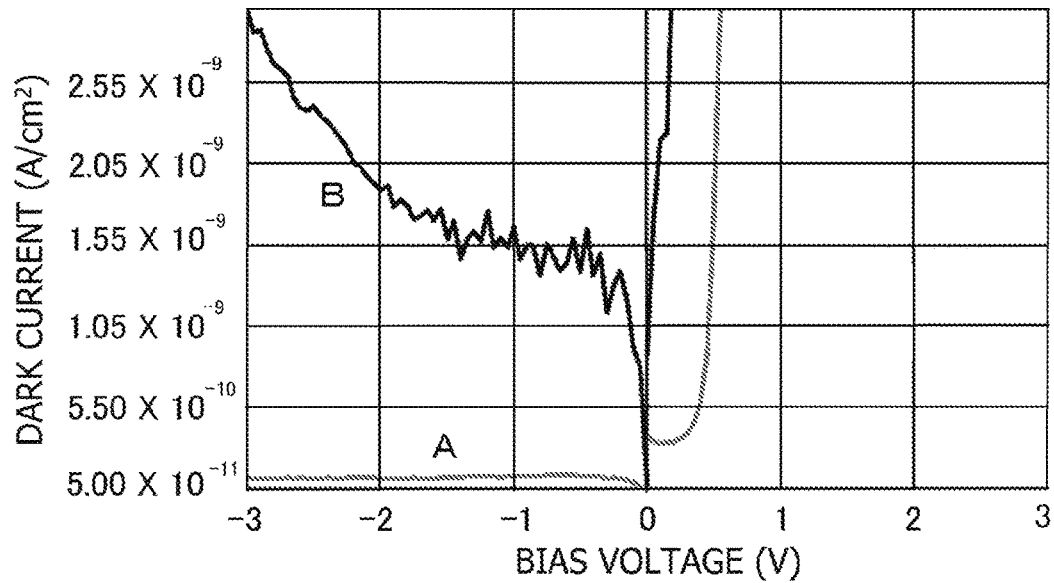

FIG. 2A depicts the I-V curves of light current observed in the electronic devices (photoelectric conversion elements) of Example 1A and Comparative Example 1, the former having the first electrode 21 formed from indium-cerium complex oxide (ICO) and the latter having the first electrode 21 formed from ITO. The curves "A" and "B," each represents the results in Example 1A and Comparative Example 1 throughout the FIGS. 2A, 2B, 3A, and 3B. It is noted from FIG. 2A that the electronic device of Example 1A steeply increases in current upon application of a reverse bias voltage slightly lower than 1 volt (or a bias voltage slightly lower than −1 volt). Also, it gives a dark current as indicated by the I-V curve in FIG. 2B. It is noted that the dark current in Comparative Example 1 is $2 \times 10^{-9}$ A/cm² at a bias voltage of −3 volt, whereas the dark current in Example 1A is as low as $6 \times 10^{-11}$ A/cm² under the same conditions.

Furthermore, the electronic devices of Example 1A and Comparative Example 1 is found to have the internal quantum efficiency as depicted in Table 2 below. The internal quantum efficiency η denotes the ratio of the number of incident photons to the number of emitted electrons. It is represented by the equation below. Table 2 also depicts the measurement result of the surface roughness of the first electrode. It is noted that there is a difference (lager than an order of magnitude) between Example 1A and Comparative Example 1. The first electrode 21 of Example 1 has a surface roughness (arithmetic mean roughness) Ra no larger than 1 nm and a surface roughness Rms no larger than 2 nm.

$$\eta = \{(h \cdot c)/(q^* \lambda)\}(I/P) = (1.24/\lambda)(I/P)$$

where,
h: Planck constant
c: light velocity
q: charge of electron
λ: wavelength of incident light (μm)
I: light current (A/cm²) at 1 V of reverse voltage (in measurements for Example 1)
P: power of incident light (A/cm²)

TABLE 2

|  | Internal quantum efficiency (%) | Ra (nm) | Rms (nm) |
|---|---|---|---|
| Example 1A | 80 | 0.36 | 0.46 |
| Comparative Example 1 | 68 | 2.5 | 3.6 |

Figure 7A:
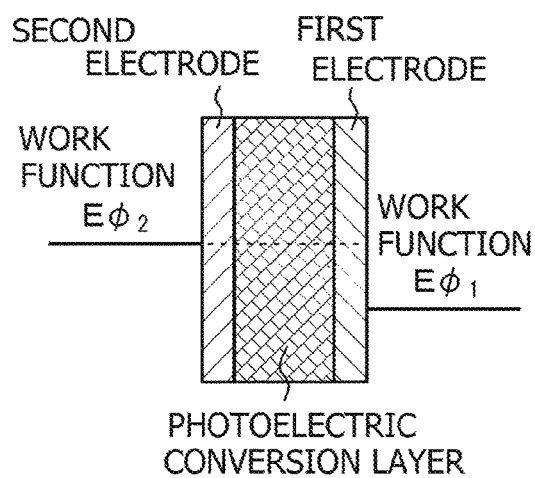
FIGS. 7A and 7B are conceptual views depicting an energy diagram in the electronic device according to Example 1 and Comparative Example 1.
Figure 7B:
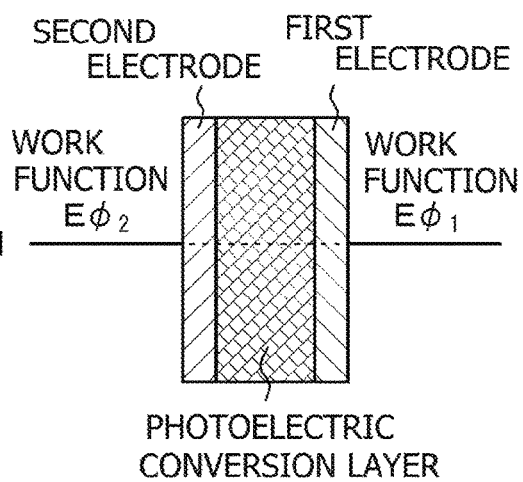
Figure 7C:
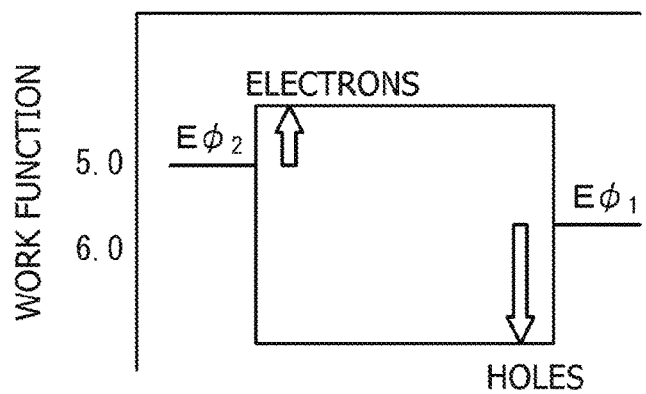
FIGS. 7C and 7D are conceptual views depicting the correlation between the difference in a work function and the energy diagram, which is observed in the electronic device according to Example 1 and Comparative Example 1.
Figure 7D:
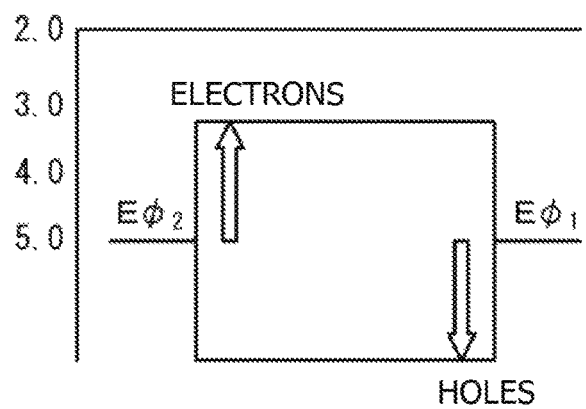

The electronic device of Comparative Example 1 has the first electrode and the second electrode which are both formed from ITO. Thus, they have no difference between their work functions $E\varphi_1$ and $E\varphi_2$, as depicted in FIG. 7B which is a schematic energy diagram. The result is that holes easily flow into the second electrode, thereby increasing the dark current. The fact that the first electrode and the second electrode have no difference between their work functions $E\varphi_1$ and $E\varphi_2$ leads to the absence of potential gradient (or the absence of the internal electric field in the photoelectric conversion layer) in releasing electrons and holes, which prevents the smooth release of electrons and holes (see conceptual view in FIG. 7D). By contrast, the electronic device of Example 1A has the first electrode, which is formed from a transparent conductive material composed of indium oxide and cerium (Ce) added thereto, and the second electrode, which is formed from ITO. Therefore, the first electrode has a work function $E\varphi_1$ and the second electrode has a work function $E\varphi_2$ such that the difference ($E\varphi_1$ minus $E\varphi_2$) is no smaller than 0.4 eV. This is illustrated by the energy diagram in FIG. 7A. This produces the effect of preventing holes from entering the second electrode, thereby suppressing dark current. The fact that the first electrode has a work function $E\varphi_1$ and the second electrode has a work function $E\varphi_2$ such that the difference ($E\varphi_1$ minus $E\varphi_2$) is no smaller than 0.4 eV leads to the presence of the potential gradient (or the presence of the internal electric field in the photoelectric conversion layer) in releasing electrons and holes, which permits the smooth release of electrons and holes (see conceptual view in FIG. 7C).

Figure 3A:
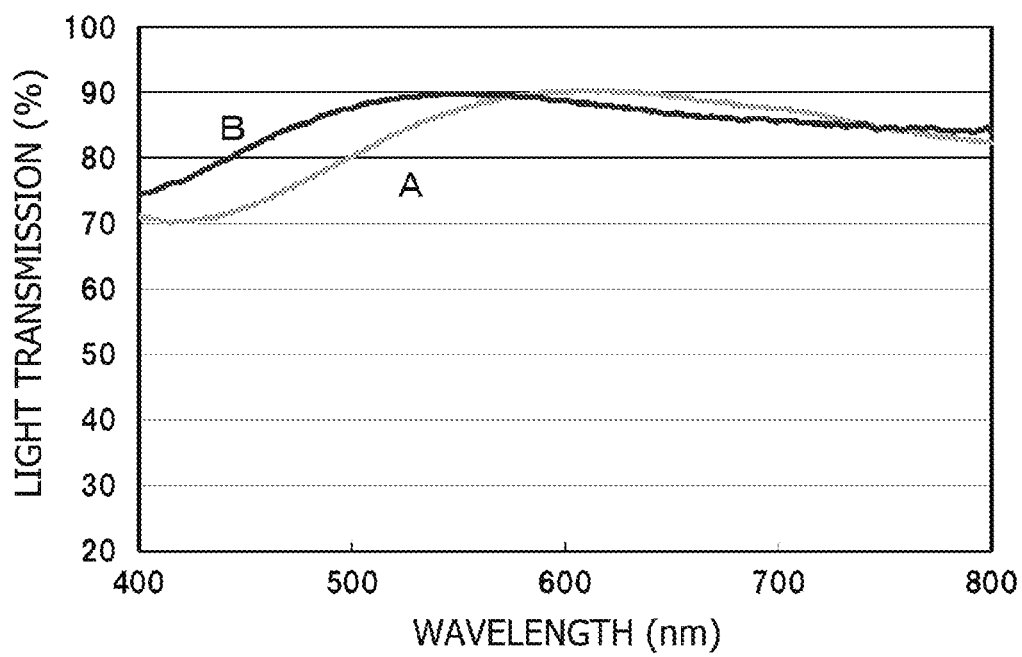
FIGS. 3A and 3B are graphs representing spectral characteristics observed in the first electrode of the electronic device according to Example 1A and Comparative Example 1.
Figure 3B:
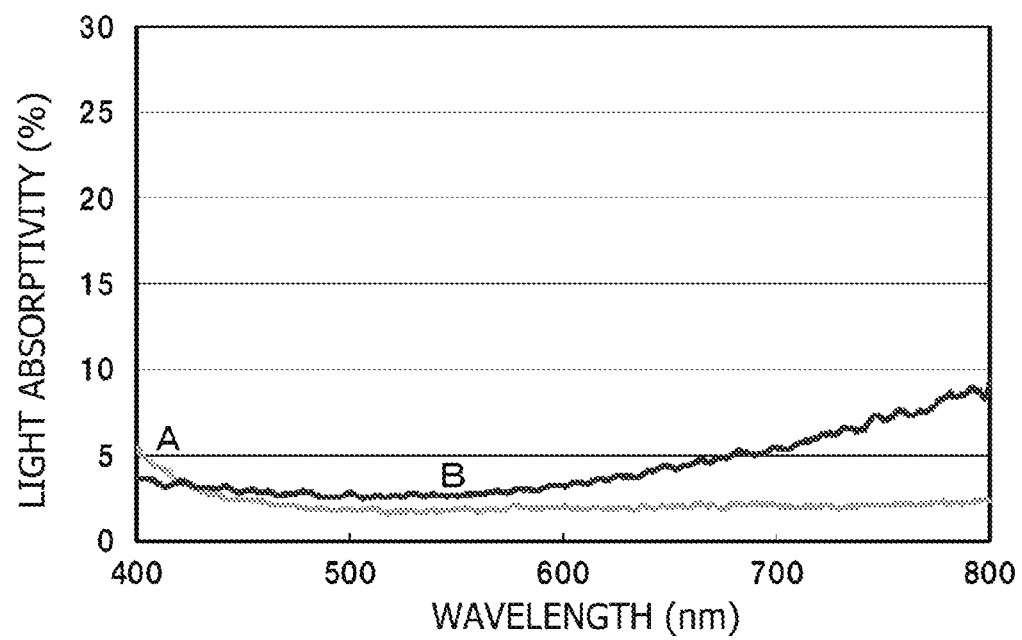

Each of the first electrodes in the electronic devices of Example 1A and Comparative Example 1 has the spectral characteristics as depicted in FIGS. 3A (for light transmittance) and 3B (for light absorptivity). Incidentally, the first electrode 21 in Example 1A has a cerium concentration of 10 atom % and a film thickness of 150 nm, whereas the first electrode in Comparative Example 1 has a film thickness of 150 nm. It is noted from FIGS. 3A and 3B that the electronic devices of Example 1A and Comparative Example 1 are almost the same in spectral characteristics.

Figure 4A:
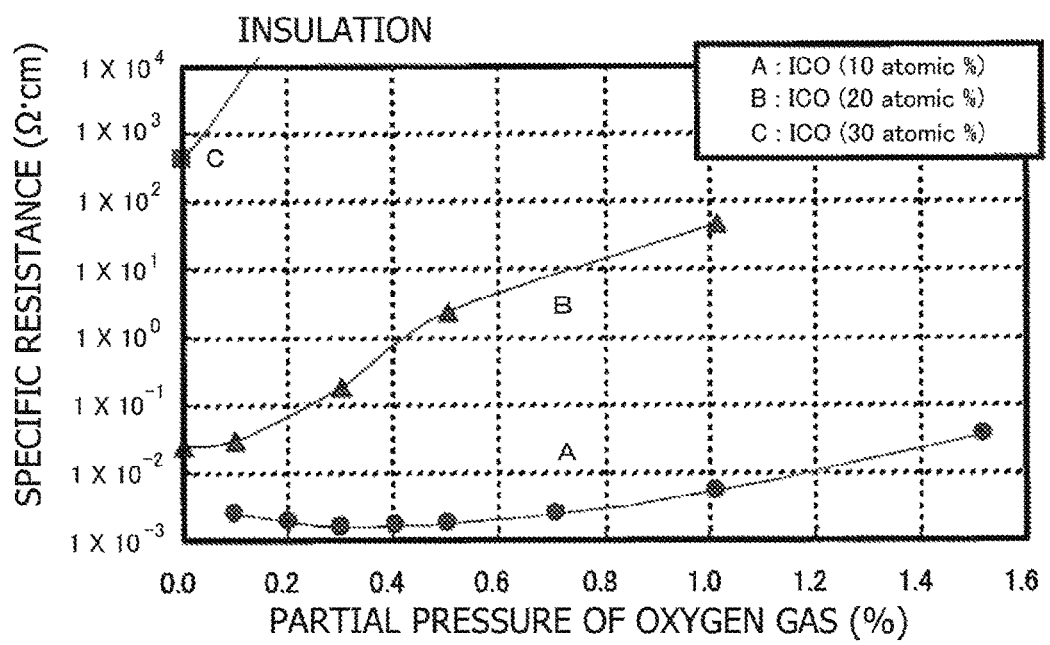
FIG. 4A is a graph depicting the result measuring relation between the amount of oxygen gas introduced (oxygen gas partial pressure) and the specific resistance while the first electrode is formed, with the first electrode varying in the amount of cerium added thereto.

The first electrode in the electronic device of Example 1A varies in the relation between the amount of oxygen gas (oxygen gas partial pressure) to be introduced to form the first electrode and the specific resistance of the first electrode, the relation depending on the concentration of cerium added to the first electrode, as depicted in FIG. 4A. The curve "A" in FIG. 4A denoted with the amount of cerium added adjusted to 10 atom %, the specific resistance was smaller than $1 \times 10^{-2}$ Ω·cm in 1% of oxygen gas partial pressure. On the other hand, the curves "B" and "C" in FIG. 4A denoted with the amount of cerium added adjusted to 20 atom % and 30 atom %, respectively, the specific resistance was exceeded $1 \times 10^{-2}$ Ω·cm.

Figure 4B:
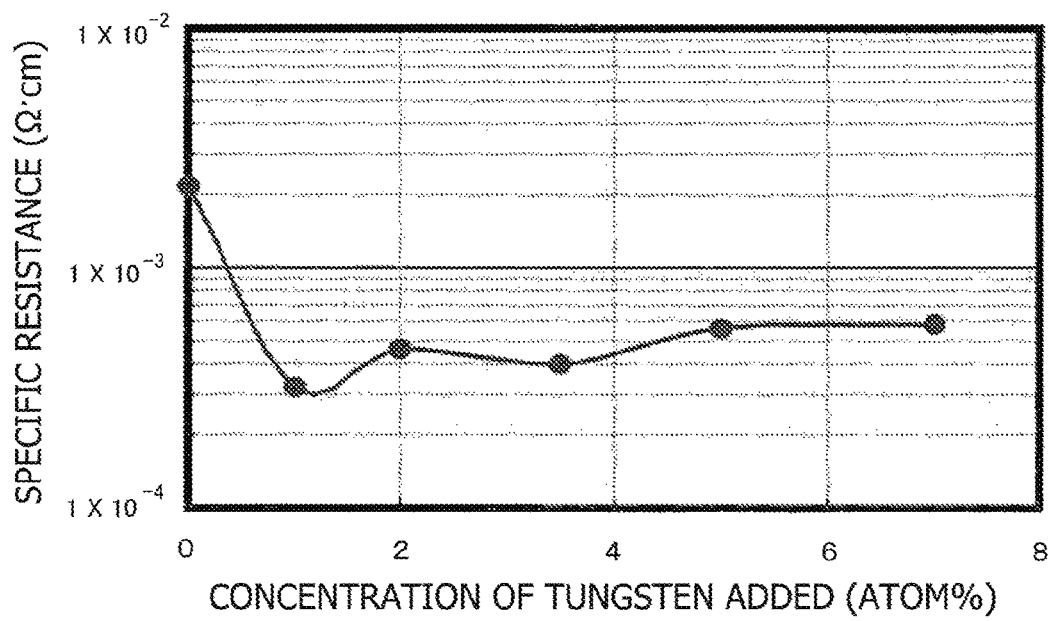
FIG. 4B is a graph depicting the result measuring relation between the amount of tungsten added to the first electrode and the specific resistance, which is observed in the electronic device according to Example 1C in which the first electrode is formed from an indium-tungsten complex oxide.

The electronic device of Example 1C has the first electrode 21 which is formed from indium-tungsten complex oxide. The first electrode 21 gave the specific resistance which varies depending on the amount of tungsten added as depicted in FIG. 4B. It is noted that the first electrode has a specific resistance no higher than $1 \times 10^{-3}$ Ω·cm in the case where the amount of tungsten added is 1 to 7 atom %.

Figure 5A:
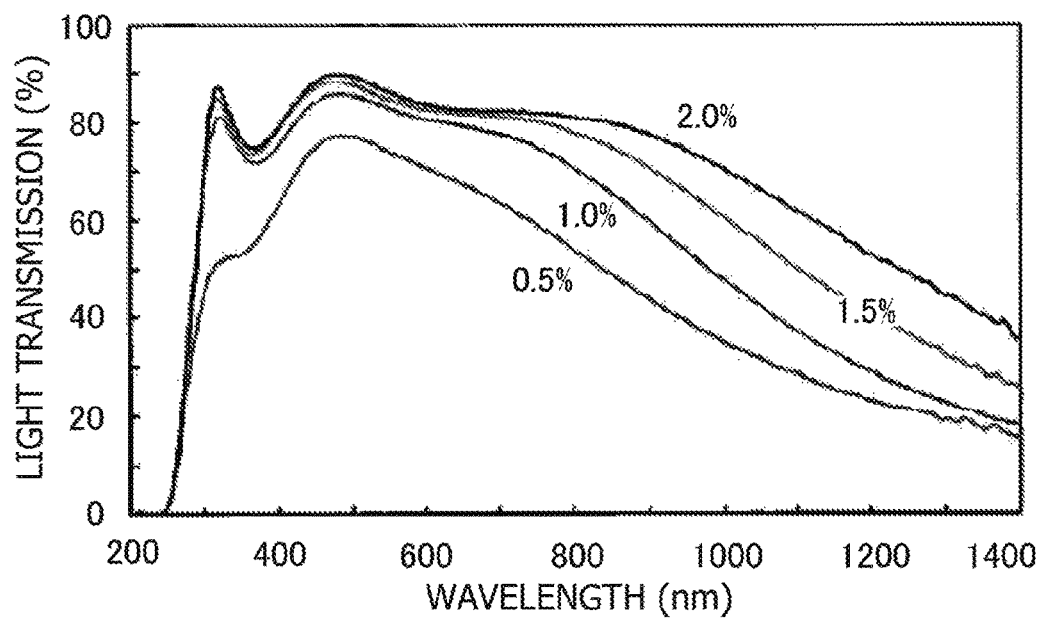
FIG. 5A is a graph depicting the result measuring relation between the amount of oxygen gas introduced (oxygen gas partial pressure) and the light transmission while the first electrode is formed, which is observed in the electronic device according to Example 1C in which the first electrode is given tungsten added thereto in an amount of 2 atom %.

The first electrode in the electronic device of Example 1C varies in the relation between the amount of oxygen gas (oxygen gas partial pressure) to be introduced to form the first electrode and the light transmittance of the first electrode, with the amount of tungsten added to the first electrode kept at 2 atom %, as depicted in FIG. 5A. In addition, experiments were carried out in which the partial pressure of oxygen gas supplied to form the film was adjusted to 0.5%, 1.0%, 1.5%, and 2.0%. It was found that the sample with the oxygen gas partial pressure higher than 1% gave an average visible light transmittance of 82% in Comparative Example 1 and 84% in Example 1C. In other words, the light transmittance is almost the same in both Example 1C and Comparative Example 1.

The electronic device of Example 1B has the first electrode 21 which is formed from indium-gallium complex oxide. The first electrode 21 gave the specific resistance which varies depending on the amount of gallium added as depicted in Table 3 below. It is noted that the first electrode keeps a specific resistance of $1\times10^{-3}$ $\Omega\cdot$cm in the case where the amount of gallium added is up to 30 atom %. Incidentally, the specific resistance of ITO (Sn: 10 atom %) was $1\times10^{-4}$ $\Omega\cdot$cm.

TABLE 3

| Amount of gallium added (atom %) | Specific resistance ($\Omega \cdot$ cm) |
| --- | --- |
| 10 | $4.5 \times 10^{-4}$ |
| 20 | $7.1 \times 10^{-4}$ |
| 30 | $1.2 \times 10^{-3}$ |
| 40 | $2.8 \times 10^{-3}$ |

Figure 5B:
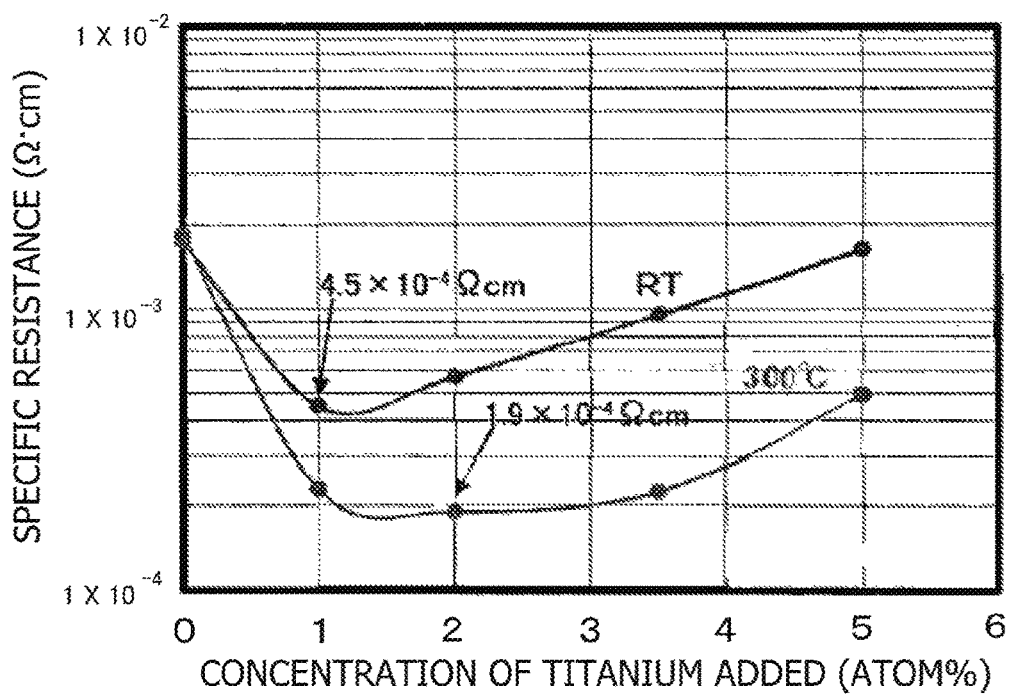
FIG. 5B is a graph depicting the result measuring relation between the amount of titanium added to the first electrode and the specific resistance, which is observed in the electronic device according to Example 1D in which the first electrode is formed from an indium-titanium complex oxide.

The electronic device of Example 1D has the first electrode 21 which is formed from indium-titanium complex oxide. The first electrode 21 gave the specific resistance which varies depending on the amount of titanium added as depicted in FIG. 5B. It is noted that the specific resistance is $1\times10^{-3}$ $\Omega$/cm in the case where the amount of titanium added is no larger than 4 atom % if the film-forming step is carried out at room temperature (RT). It is also noted that the specific resistance is $1\times10^{-3}$ $\Omega$/cm in the case where the amount of titanium added is no larger than 5 atom % even though the film-forming step is carried out at 300° C.

Figure 6:
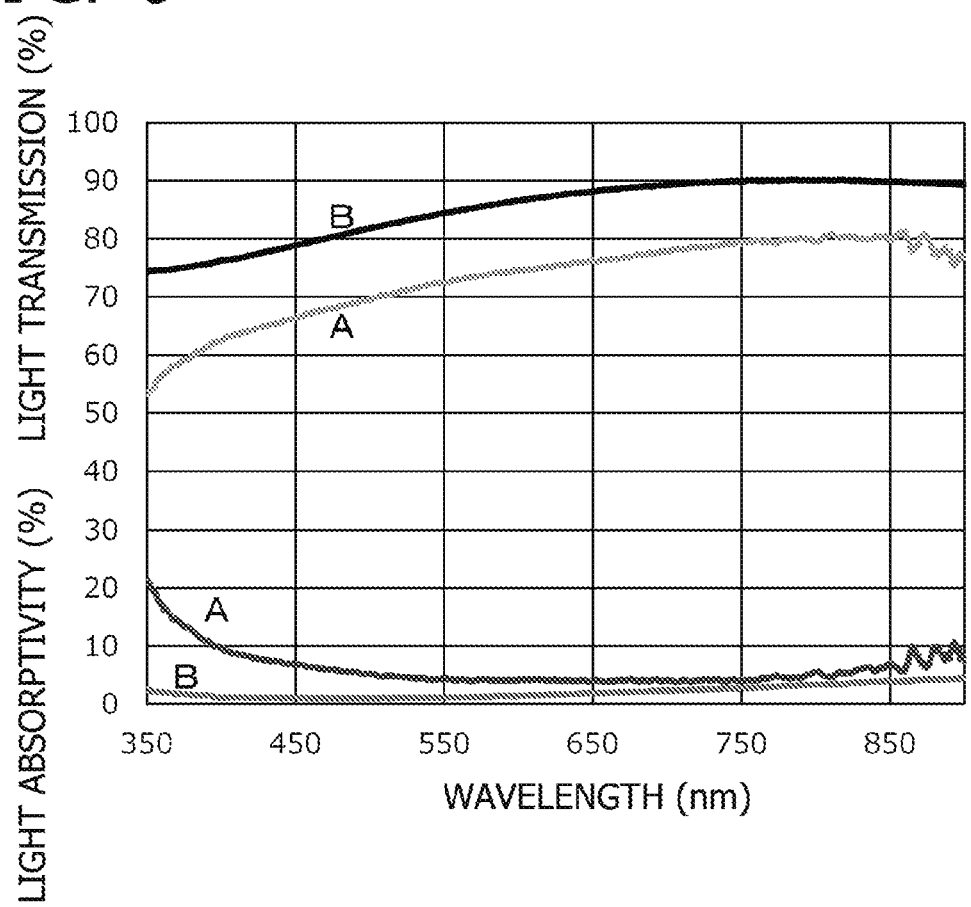
FIG. 6 is a graph depicting spectral characteristics of the first electrode in the electronic device according to Example 1E and Comparative Example 1.

The electronic devices of Example 1E and Comparative Example 1 each has the first electrode which gives the spectral characteristics depicted in FIG. 6. The upper and lower parts of FIG. 6 depict the light transmittance and the light absorptivity, respectively. Incidentally, the electronic device of Example 1E has the first electrode 21 which contains 20 atom % of cobalt added and has a thickness of 50 nm. Also, the electronic device of Comparative Example 1 has the first electrode which has a thickness of 150 nm. In FIG. 6, the curves "A" and "B" represent respectively the data for Example 1A and the data for Comparative Example 1. It is noted that the sample of Example 1A is much higher than the sample of Comparative Example 1 in light absorptivity for light with a wavelength no larger than 400 nm. This offers an advantage that the electronic device may have another electronic device added to the lower side thereof, without the lower member being exposed to much UV light. Also, experiments were carried out in which the electronic device of Example 1E was prepared, with the amount of cobalt changed to 10 atom %, 20 atom %, or 30 atom %. The resulting samples were examined to see how the first electrode changes in work function after surface treatment with UV light irradiation. The results are depicted in Table 4. It was found that the work function does not appreciably change regardless of the amount of cobalt added.

|  | Light absorptivity at wavelength of 400 nm | Light absorptivity at wavelength of 350 nm |
| --- | --- | --- |
| Example 1E | 5.7% | 22% |
| Comparative Example 1 | 1.5% | 2.4% |

TABLE 4

| Amount of cobalt added | Work function (before surface treatment) | Work function (after surface treatment) |
| --- | --- | --- |
| 10 atom % | 5.1 eV | 5.8 eV |
| 20 atom % | 5.2 eV | 5.8 eV |
| 30 atom % | 5.1 eV | 5.8 eV |

The results mentioned above and the results obtained from various experiments suggest that the transparent conductive material should preferably be formed from indium-cerium complex oxide (ICO) composed of indium oxide and cerium added thereto, and the first electrode 21 should preferably have a thickness of $5\times10^{-8}$ to $2\times10^{-7}$ m and a specific resistance no smaller than $1\times10^{-3}$ $\Omega\cdot$cm and smaller than $1\times10^{-2}$ $\Omega\cdot$cm. The amount of cerium added should preferably be 1 to 10 atom %. Alternatively, the transparent conductive material should preferably be formed from indium-gallium complex oxide (IGO) composed of indium oxide and gallium added thereto, and the first electrode 21 should preferably have a thickness of $5\times10^{-8}$ to $1.5\times10^{-7}$ m and a specific resistance from $1\times10^{-5}$ to $1\times10^{-3}$ $\Omega\cdot$cm. The amount of gallium added should be 1 to 30 atom %, desirably be 1 to 10 atom %. Furthermore, the transparent conductive material should preferably be formed from indium-tungsten complex oxide (IWO) composed of indium oxide and tungsten added thereto, and the first electrode 21 should preferably have a thickness of $5\times10^{-8}$ to $2\times10^{-7}$ m and a specific resistance from $1\times10^{-4}$ to $1\times10^{-3}$ $\Omega\cdot$cm. The amount of tungsten added should be 1 to 7 atom %. Furthermore, the transparent conductive material should preferably be formed from indium-titanium complex oxide (ITiO) composed of indium oxide and titanium added thereto, and the first electrode 21 should preferably have a thickness of $5\times10^{-8}$ to $2\times10^{-7}$ m and a specific resistance from $1\times10^{-4}$ to $1\times10^{-3}$ $\Omega\cdot$cm. The amount of titanium added should preferably be 0.5 to 5 atom %. Furthermore, the transparent conductive material should preferably be formed from indium-cobalt complex oxide (ICoO) composed of indium oxide and cobalt added thereto, and the first electrode 21 should preferably have a thickness of $5\times10^{-8}$ to $2\times10^{-7}$ m and a specific resistance from $1\times10^{-4}$ to $1\times10^{-3}$ $\Omega\cdot$cm. The amount of cobalt added should preferably be 10 to 30 atom %.

The electronic device in which the second electrode 22 is formed from ITO will be obtained from the electronic device in which the second electrode 22 is formed from any one of indium-zinc complex oxide (IZO), tin oxide (SnO$_2$), indium-doped gallium-zinc complex oxide (IGZO, InGaZnO$_4$), aluminum oxide-doped zinc oxide (AZO), indium-zinc complex oxide (IZO), and gallium-doped zinc oxide (GZO) will also function substantially in the same way as the electronic device of Example 1 in which the second electrode 22 is formed from ITO.

The fact that the electronic device of Example 1 has the first electrode which is made of a transparent conductive material with a work function ranging from 5.2 to 5.9 eV, as mentioned above, results in a large difference in work functions between the first electrode and the second electrode. This makes it possible to form the second electrode from any one selected from a wide range of transparent conductive materials, which leads to the production of an electronic device having superior characteristic properties. Moreover, the first and second electrodes having the specific work functions mentioned above cause the photoelectric conversion layer to generate a large internal electric field when a bias voltage (or a reverse bias voltage) is applied across them. This improves the internal quantum efficiency and increases the photoelectric current while suppressing dark current.

Example 2

Example 2 is concerned with the solid state imaging apparatus according to the present disclosure. The solid state imaging apparatus of Example 2 is provided with the electronic devices (or photoelectric conversion elements) of Example 1.

Figure 8:
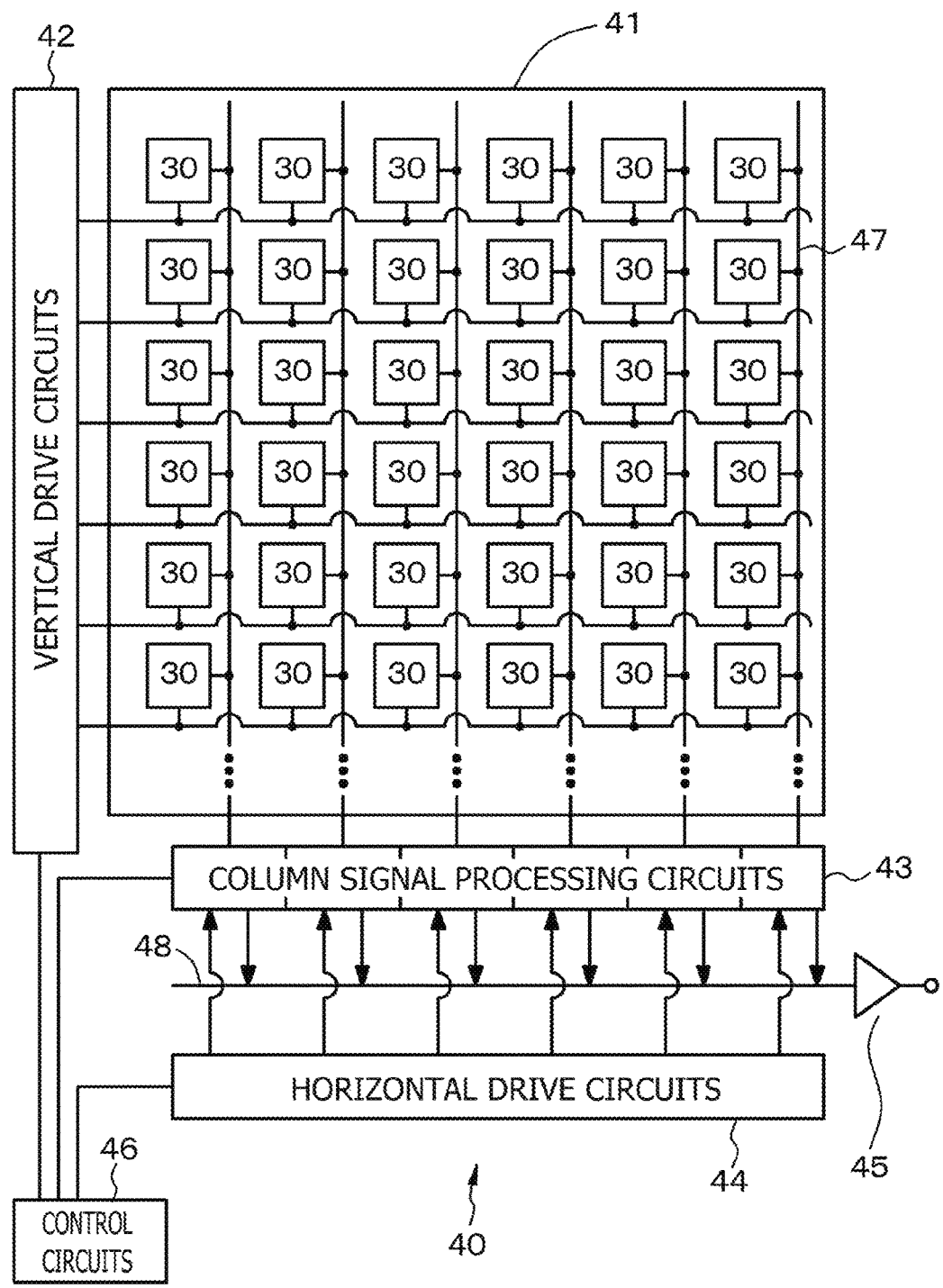
FIG. 8 is a schematic view depicting a solid state imaging apparatus according to Example 2.

The solid state imaging apparatus (or solid state imaging element) of Example 2 is schematically depicted in FIG. 8. A solid state imaging apparatus 40 of Example 2 is included of the semiconductor substrate (or silicon semiconductor substrate) and an imaging region 41 formed thereon which has electronic devices (photoelectric conversion elements) 30 described in Example 1, which are arranged in a pattern of two-dimensional array. The solid state imaging apparatus 40 also has peripheral circuits such as vertical drive circuits 42, column signal processing circuits 43, horizontal drive circuits 44, and control circuits 46. These circuits may be formed from any known ones. The circuit structure is not limited to the one mentioned above; it will be possible to use various circuits used for the existing CCD or CMOS imaging apparatus.

The control circuit 46 generates the clock signals and control signals (in response to vertical synchronous signals, horizontal synchronous signals, and master clock) which function as the standard for action of the vertical drive circuits 42, the column signal processing circuits 43, the horizontal drive circuits 44. The thus generated clock signals and control signals are put into the vertical drive circuits 42, the column signal processing circuits 43, and the horizontal drive circuits 44.

The vertical drive circuits 42 are included of shift registers or the like. It selects and scans the electronic devices 30 in the imaging region 41 row by row in the vertical direction. Each of the electronic devices 30 generates the pixel signal in response to the current (signal) which has been generated in proportion to the amount of incident light. The pixel signal is sent to the column signal processing circuit 43 through a vertical signal line 47.

The column signal processing circuits 43 are arranged for each column in the electronic device 30. They process the signals from the electronic devices 30 in one column, thereby removing noise and amplifying signals. This signal processing is based on the signal from the black reference pixel (formed around the effective pixel region, not depicted). The column signal processing circuit 43 has the output stage in which the horizontal selection switch (not depicted) is connected to a horizontal signal line 48.

The horizontal drive circuits 44 are included of the shift registers. They output the horizontal scanning pulses sequentially, thereby selecting the column signal processing circuits 43 sequentially and causing the column signal processing circuits 43 to send signals to the horizontal signal line 48.

An output circuit 45 processes the signals which are sequentially supplied thorough the horizontal signal line 48 from the column signal processing circuit 43.

The photoelectric conversion layer may be constructed such that it functions as the color filter by itself if it is formed from an appropriate material. In this case, the color filter is not necessary for color separation. However, if necessary, the electronic device 30 has its upper surface (for the incident light) coated with any known color filter that transmits light of specific wavelength such as red, green, blue, cyan, magenta, and yellow. In addition, the solid state imaging apparatus may be of front irradiation type or of rear irradiation type. Moreover, if necessary, the electronic device 30 may be provided with a shutter to control the amount of incident light.

The present disclosure has been described above with reference to the preferred embodiment. However, the present disclosure is not restricted to the embodiments mentioned above. The electronic device (photoelectric conversion element) and the solid state imaging apparatus which have been explained in Examples are based on the structure, configuration, manufacturing conditions, manufacturing process, and materials to be used specified above; however, they are merely exemplary and they may be properly changed according to need. The electronic device according to the present disclosure may be used as the solar cell. In this case, the photoelectric conversion layer should be exposed to sunlight without voltage applied across the first electrode and the second electrode. In addition, the electronic device according to the present disclosure may find use for optical sensors and image sensors in addition to the imaging apparatus (solid state imaging apparatus) such as TV cameras.

The present disclosure disclosed herein may be variously modified as follows.

[A01]<<Electronic Device>>

An electronic device including a first electrode, a second electrode, and a photoelectric conversion layer held between the first electrode and the second electrode, in which the first electrode is formed from a transparent conductive material having a work function ranging from 5.2 to 5.9 eV.

[A02] The electronic device as defined in [A01], in which the transparent conductive material is composed of indium oxide and at least one metal species selected from a group consisting of cerium, gallium, tungsten, and titanium, with the metal species accounting for 0.5 to 10 atom % of the total amount (100 atom %) of the indium and the metal species.

[A03] The electronic device as defined in [A01], in which the transparent conductive material is composed of indium oxide and cobalt, with the cobalt accounting for 10 to 30 atom % of the total amount (100 atom %) of indium and cobalt.

[A04] The electronic device as defined in any one of [A01] to [A03], in which the first electrode has a specific resistance smaller than $1 \times 10^{-2}$ Ω·cm.

[A05] The electronic device as defined in any one of [A01] to [A04], in which the first electrode has a sheet resistance of $3 \times 10$ to $1 \times 10^3 \Omega/\square$.

[A06] The electronic device as defined in any one of [A01] to [A05], in which the first electrode has a refractive index of 1.9 to 2.2.

[A07] The electronic device as defined in any one of [A01] to [A06], in which the first electrode has a surface roughness Ra no larger than 1 nm.

[A08] The electronic device as defined in [A07], in which the first electrode has a surface roughness Rms no larger than 2 nm.

[A09] The electronic device as defined in any one of [A01] to [A08], in which the first electrode has a thickness ranging from $1\times10^{-8}$ to $2\times10^{-7}$ m.

[A10] The electronic device as defined in [A09], in which the first electrode has a thickness ranging from $2\times10^{-8}$ to $1\times10^{-7}$ m.

[A11] The electronic device as defined in [A01], in which the transparent conductive material is formed from a material composed of indium oxide and cerium added thereto, and the first electrode has a thickness ranging from $5\times10^{-8}$ to $2\times10^{-7}$ m and a specific resistance no smaller than $1\times10^{-3}$ $\Omega\cdot$cm and smaller than $1\times10^{-2}$ $\Omega\cdot$cm.

[A12] The electronic device as defined in [A11], in which cerium accounts for 1 to 10 atom % of the total amount (100 atom %) of indium and cerium.

[A13] The electronic device as defined in [A01], in which the transparent conductive material is composed of indium oxide and gallium added thereto, and the first electrode has a thickness ranging from $5\times10^{-8}$ to $1.5\times10^{-7}$ m and a specific resistance ranging from $1\times10^{-5}$ to $1\times10^{-3}$ $\Omega\cdot$cm.

[A14] The electronic device as defined in [A13], in which the gallium accounts for 1 to 30 atom %, preferably 1 to 10 atom %, of the total amount (100 atom %) of indium and gallium.

[A15] The electronic device as defined in [A01], in which the transparent conductive material is composed of indium oxide and tungsten added thereto, and the first electrode has a thickness ranging from $5\times10^{-8}$ to $2\times10^{-7}$ m and a specific resistance ranging from $1\times10^{-4}$ to $1\times10^{-3}$ $\Omega\cdot$cm.

[A16] The electronic device as defined in [A15], in which the tungsten accounts for 1 to 7 atom % of the total amount (100 atom %) of indium and tungsten.

[A17] The electronic device as defined in [A01], in which the transparent conductive material is composed of indium oxide and titanium added thereto, and the first electrode has a thickness ranging from $5\times10^{-8}$ to $2\times10^{-7}$ m and a specific resistance ranging from $1\times10^{-4}$ to $1\times10^{-3}$ $\Omega\cdot$cm.

[A18] The electronic device as defined in [A17], in which the titanium accounts for 0.5 to 5 atom % of the total amount (100 atom %) of indium and titanium.

[A19] The electronic device as defined in [A01], in which the transparent conductive material is composed of indium oxide and cobalt added thereto, and the first electrode has a thickness ranging from $5\times10^{-8}$ to $2\times10^{-7}$ m and a specific resistance ranging from $1\times10^{-4}$ to $1\times10^{-3}$ $\Omega\cdot$cm.

[A20] The electronic device as defined in [A19], in which the cobalt accounts for 10 to 30 atom % of the total amount (100 atom %) of indium and cobalt.

[A21] The electronic device as defined in any one of [A01] to [A20], in which the first electrode and the second electrode have respective work functions such that the subtraction of the second from the first is no smaller than 0.4 eV.

[A22] The electronic device as defined in any one of [A01] to [A21], in which the first electrode and the second electrode have respective work functions such that the subtraction of the second from the first is no smaller than 0.4 eV, so that the difference in work function causes the photoelectric conversion layer to generate an internal electric field, thereby improving an internal quantum efficiency.

[A23] The electronic device as defined in any one of [A01] to [A22], in which the second electrode has a work function no larger than 5.0 eV.

[A24] The electronic device as defined in any one of [A01] to [A23], in which the second electrode is formed from indium-tin complex oxide, indium-zinc complex oxide, or tin oxide.

[A25] The electronic device as defined in any one of [A01] to [A23], in which the second electrode is formed from indium-doped gallium-zinc complex oxide, aluminum oxide-doped zinc oxide, indium-zinc complex oxide, or gallium-doped zinc oxide.

[A26] The electronic device as defined in any one of [A01] to [A25], in which the first electrode is formed by sputtering.

[A27] The electronic device as defined in [A26], in which the first electrode has the spectral bandwidth of transmitting light controlled by adjusting the amount of oxygen gas introduced to form the first electrode by sputtering.

[A28] The electronic device as defined in any one of [A01] to [A25], in which the first electrode contains oxygen in an amount less than the stoichiometric content.

[A29] The electronic device as defined in any one of [A01] to [A28], which is included of the substrate, the first electrode, the photoelectric conversion layer, and the second layer which are arranged sequentially top on the other.

[B01]<<Solid state imaging apparatus>>

A solid state imaging apparatus which has the electronic devices defined in any one of [A01] to [A29].

REFERENCE SIGNS LIST

10 . . . Substrate
11 . . . Wiring
12 . . . Insulating layer
13 . . . Opening
21 . . . First electrode
22 . . . Second electrode
23 . . . Photoelectric conversion layer
30 . . . Electronic device (photoelectric conversion element)
40 . . . Solid state imaging apparatus
41 . . . Imaging region
42 . . . Vertical drive circuits
43 . . . Column signal processing circuits
44 . . . Horizontal drive circuits
45 . . . Output circuit
46 . . . Control circuits
47 . . . Vertical signal line
48 . . . Horizontal signal line

The invention claimed is:

1. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV, and
the transparent conductive material is composed of indium oxide and at least one metal species selected from a group consisting of cerium, gallium, tungsten, and titanium, with the metal species accounting for 0.5 to 10 atom % of a total amount, 100 atom % of indium and the metal species.

2. An electronic device, comprising:
a first electrode;
a second electrode; and a photoelectric conversion layer between the first electrode and the second electrode, wherein
the first electrode is formed from a transparent conductive material having a work function ranging from 5.2 to 5.9 eV, and
the transparent conductive material is composed of indium oxide and cobalt, with the cobalt accounting for 10 to 30 atom % of a total amount, 100 atom % of indium and cobalt.

3. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the first electrode has a specific resistance smaller than $1 \times 10^{-2}$ $\Omega \cdot cm$,
the transparent conductive material is composed of indium oxide and at least one metal species selected from a group consisting of cerium, gallium, tungsten, and titanium, with the metal species accounting for 0.5 to 10 atom % of a total amount, 100 atom % of indium and the metal species,
the first electrode has a refractive index of 1.9 to 2.2, and
the first electrode has a surface roughness Ra no larger than 1 nm.

4. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the transparent conductive material is formed from a material composed of indium oxide and cerium added thereto, and
the first electrode has a thickness ranging from $5 \times 10^{-8}$ to $2 \times 10^{-7}$ m and a specific resistance no smaller than $1 \times 10^{-3}$ $\Omega \cdot cm$ and smaller than $1 \times 10^{-2}$ $\Omega \cdot cm$.

5. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the transparent conductive material is composed of indium oxide and gallium added thereto, and
the first electrode has a thickness ranging from $5 \times 10^{-8}$ to $1.5 \times 10^{-7}$ m and a specific resistance ranging from $1 \times 10^{-5}$ to $1 \times 10^{-3}$ $\Omega \cdot cm$.

6. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the transparent conductive material is composed of indium oxide and tungsten added thereto, and
the first electrode has a thickness ranging from $5 \times 10^{-8}$ to $2 \times 10^{-7}$ m and a specific resistance ranging from $1 \times 10^{-4}$ to $1 \times 10^{-3}$ $\Omega \cdot cm$.

7. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the transparent conductive material is composed of indium oxide and titanium added thereto, and
the first electrode has a thickness ranging from $5 \times 10^{-8}$ to $2 \times 10^{-7}$ m and a specific resistance ranging from $1 \times 10^{-4}$ to $1 \times 10^{-3}$ $\Omega \cdot cm$.

8. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the transparent conductive material is composed of indium oxide and cobalt added thereto, and
the first electrode has a thickness ranging from $5 \times 10^{-8}$ to $2 \times 10^{-7}$ m and a specific resistance ranging from $1 \times 10^{-4}$ to $1 \times 10^{-3}$ $\Omega \cdot cm$.

9. The electronic device as defined in claim 1, wherein the first electrode has a thickness ranging from $1 \times 10^{-8}$ to $2 \times 10^{-7}$ m.

10. The electronic device as defined in claim 9, wherein the first electrode has the thickness ranging from $2 \times 10^{-8}$ to $1 \times 10^{-7}$ m.

11. The electronic device as defined in claim 1, wherein the first electrode and the second electrode have respective work functions such that a result of subtraction of a work function of the second electrode from a work function of the first electrode is no smaller than 0.4 eV.

12. The electronic device as defined in claim 1, wherein
the first electrode and the second electrode have respective work functions such that a result of subtraction of a work function of the second electrode from a work function of the first electrode is no smaller than 0.4 eV, and
a difference in the work functions causes the photoelectric conversion layer to generate an internal electric field to improve an internal quantum efficiency.

13. The electronic device as defined in claim 1, wherein the second electrode has a work function no larger than 5.0 eV.

14. The electronic device as defined in claim 1, wherein the second electrode is formed from indium-tin complex oxide, indium-zinc complex oxide, or tin oxide.

15. The electronic device as defined in claim 1, wherein the first electrode contains oxygen in an amount less than a stoichiometric content.

16. A solid state imaging apparatus which has the electronic device defined in claim 1.

17. The electronic device as defined in claim 2, wherein the first electrode has a thickness ranging from $1 \times 10^{-8}$ to $2 \times 10^{-7}$ m.

18. The electronic device as defined in claim 17, wherein the first electrode has the thickness ranging from $2 \times 10^{-8}$ to $1 \times 10^{-7}$ m.

19. The electronic device as defined in claim 2, wherein the first electrode and the second electrode have respective work functions such that a result of subtraction of a work function of the second electrode from a work function of the first electrode is no smaller than 0.4 eV.

20. The electronic device as defined in claim 2, wherein the first electrode and the second electrode have respective work functions such that a result of subtraction of a work function of the second electrode from a work function of the first electrode is no smaller than 0.4 eV, and
a difference in the work functions causes the photoelectric conversion layer to generate an internal electric field to improve an internal quantum efficiency.

21. The electronic device as defined in claim 2, wherein the second electrode has a work function no larger than 5.0 eV.

22. The electronic device as defined in claim 2, wherein the second electrode is formed from indium-tin complex oxide, indium-zinc complex oxide, or tin oxide.

23. The electronic device as defined in claim 2, wherein the first electrode contains oxygen in an amount less than a stoichiometric content.

24. A solid state imaging apparatus which has the electronic device defined in claim 2.

25. An electronic device, comprising:
a first electrode;
a second electrode; and
a photoelectric conversion layer between the first electrode and the second electrode, wherein
the first electrode is formed from a transparent conductive material having a work function ranging from 5.2 to 5.9 eV,
the first electrode has a specific resistance smaller than $1 \times 10^{-2}$ Ω·cm,
the transparent conductive material is composed of indium oxide and cobalt, with the cobalt accounting for 10 to 30 atom % of a total amount, 100 atom % of indium and cobalt,
the first electrode has a refractive index of 1.9 to 2.2, and
the first electrode has a surface roughness Ra no larger than 1 nm.

* * * * *